United States Patent
Kim et al.

(10) Patent No.: US 6,188,452 B1
(45) Date of Patent: Feb. 13, 2001

(54) ACTIVE MATRIX LIQUID CRYSTAL DISPLAY AND METHOD OF MANUFACTURING SAME

(75) Inventors: Jeong-Hyun Kim, Anyang; Sung-Il Park, Taeku, both of (KR)

(73) Assignee: LG Electronics, Inc, Seoul (KR)

( * ) Notice: Under 35 U.S.C. 154(b), the term of this patent shall be extended for 0 days.

(21) Appl. No.: 08/889,096

(22) Filed: Jul. 7, 1997

Related U.S. Application Data

(63) Continuation-in-part of application No. 08/826,804, filed on Mar. 25, 1997, now Pat. No. 6,100,954.

(30) Foreign Application Priority Data

Jul. 9, 1996 (KR) .................................................. 96-27653
Jul. 9, 1996 (KR) .................................................. 96-27655

(51) Int. Cl.[7] .................... G02F 1/136; G02F 1/1333; G02F 1/13; H01L 29/09
(52) U.S. Cl. ..................... 349/43; 349/187; 349/138; 257/59; 438/158
(58) Field of Search .................... 349/187, 138, 349/42, 43; 438/158; 257/59, 72

(56) References Cited

U.S. PATENT DOCUMENTS

| | | | |
|---|---|---|---|
| 4,636,038 | 1/1987 | Kitahara et al. | 350/339 |
| 4,778,741 | * 10/1988 | Yasui et al. | 430/66 |
| 5,005,056 | * 4/1991 | Motai et al. | 357/2 |
| 5,045,905 | 9/1991 | Motai et al. | 357/23.7 |
| 5,157,470 | * 10/1992 | Matsuzaki et al. | 357/23.7 |
| 5,177,588 | 1/1993 | Ii et al. | 257/640 |
| 5,229,644 | 7/1993 | Wakai et al. | 257/749 |
| 5,281,546 | 1/1994 | Possin et al. | 437/40 |
| 5,488,000 | * 1/1996 | Zhang et al. | 437/21 |
| 5,641,974 | 6/1997 | den Boer et al. | 257/39 |

FOREIGN PATENT DOCUMENTS

| | | |
|---|---|---|
| 41 40 180 A1 | 12/1992 | (DK) . |
| 0 486 047 A2 | 5/1992 | (EP) . |
| 0 486 047 A3 | 5/1992 | (EP) . |
| 0 616 241 A2 | 9/1994 | (EP) . |

(List continued on next page.)

OTHER PUBLICATIONS

M.J. Radler et al., *Cyclotene™ Advanced Electronics Resins for High–Aperture AMLCD Applications*, SID 96 Applications Digest, pp. 33–36 (1996).

D.J. Perettie et al., *Benzocyclobutene as a Planarization Overcoat for Flat Panel Displays*, Asia Display '95, pp. 721–724 (1995).

Koji Kishimoto, *Low–dielectric–constant interlayer insulating film and its manufacturing method*, Electronic Journal, pp. 33–35 (Mar. 1996).

(List continued on next page.)

*Primary Examiner*—William L. Sikes
*Assistant Examiner*—Toan Ton
(74) *Attorney, Agent, or Firm*—Morgan, Lewis & Bockius LLP

(57) ABSTRACT

A method of manufacturing a liquid crystal display having a thin film transistor including a gate electrode extending from a gate line, a first insulation layer covering the gate electrode, a semiconductor layer, an ohmic contact layer, a source electrode extending from a data bus line, a drain electrode, and a second insulation layer covering the semiconductor layer, the method including the steps of performing a surface-treatment, such as plasma treatment, on a surface of the semiconductor layer, and forming the second insulation layer made of an organic material on the treated surface of the semiconductor layer.

19 Claims, 13 Drawing Sheets

FOREIGN PATENT DOCUMENTS

| | | |
|---|---|---|
| 0 714 140 A1 | 5/1996 | (EP) . |
| 63-279228 | 11/1988 | (JP) . |
| 63-289955 | 11/1988 | (JP) . |
| 4-68318 | 3/1992 | (JP) . |
| 4-163528 | 6/1992 | (JP) . |
| 4-257826A | 9/1992 | (JP) . |

OTHER PUBLICATIONS

Toshihara Ueki et al., *Dye embedded BM resin and three dimensional picture element implemented by BM on Array technology for the first time*, Nikkei Microdevices, pp. 60–62 (Jul. 1994).

* cited by examiner

FIG. 10
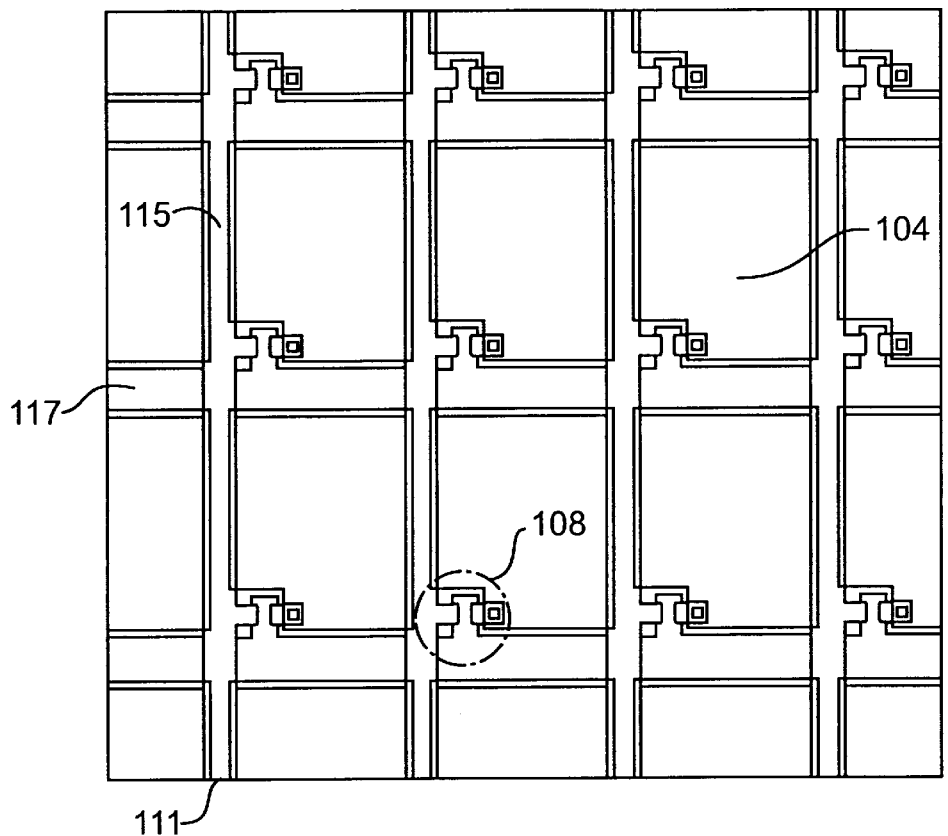
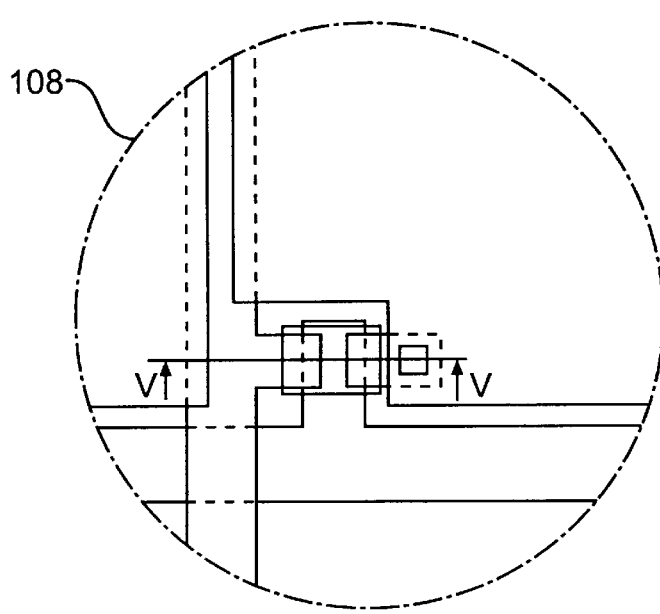
FIG. 10A

ACTIVE MATRIX LIQUID CRYSTAL DISPLAY AND METHOD OF MANUFACTURING SAME

CROSS REFERENCE TO RELATED APPLICATION

This application is a continuation-in-part of U.S. patent application Ser. No. 08/826,804, entitled "LIQUID CRYSTAL DISPLAY AND METHOD FOR MANUFACTURING THE SAME", filed on Mar. 25, 1997, the content of which is relied upon and incorporated by reference.

BACKGROUND OF THE INVENTION

1. Field of the Invention

The present invention relates to an active matrix liquid crystal display (AMLCD), and more particularly, to an AMLCD having thin film transistors (TFTs) as switching elements.

2. Description of the Related Arts

FIG. 1 shows a conventional active matrix liquid crystal display. The conventional AMLCD includes two substrates(a first and a second substrates), in which a plurality of pixels are formed in a matrix array.

On the first substrate 3, pixel electrodes 4 are disposed at the intersections between gate bus lines 17 and data bus lines 15. Gate bus lines 17 are formed in the horizontal direction and include gate electrodes(not shown) branching off therefrom. The data bus lines 15 are formed in the vertical direction and include data electrodes (not shown) branching off therefrom. At the intersections between the gate bus lines and the data bus lines, TFTs 8 are formed which make electrical contact with pixel electrodes 4.

On the second substrate 2, a color filter layer 38 and a common electrode 37 are formed.

The first and the second substrates are bonded together with a space therebetween. The space between the substrates is filled with a liquid crystal material 40. Polarization plates 1 are formed on the outer surfaces of the substrates before the bonding. Reference numerals 11 and 11' in FIG. 1 represent transparent glass substrates.

The structure and the method of manufacturing the first substrate 3 according to the present invention is described in detail with reference to FIGS. 2 and 3. FIG. 2 is a plan view showing the structure of a conventional AMLCD and FIG. 3 is a cross-sectional view taken along the line III—III in FIG. 2.

The structure of a conventional AMLCD is described below. On a transparent glass substrate 11, a gate bus line 17 in the horizontal direction and a gate electrode 17a branching off therefrom are formed. The gate electrode may be anode-oxidized to improve insulating performance and prevent hill-locks on the surface. On the substrate 11 including the gate electrode 17a, a gate insulating layer 23 made of an inorganic material, such as $SiN_x$ or $SiO_2$, is formed. A semiconductor layer 22 made of amorphous silicon (a—Si) is formed on a portion of the gate insulating layer 23 over the gate electrode 17a. On the a—Si semiconductor layer, ohmic contact layers 25 made of $n^+$ a—Si are formed to be disposed a predetermined distance away from each other. On the surface including the ohmic contact layer 25, a data bus line 15 is formed in one direction. A source electrode 15a is formed to be connected to the data bus line 15. A drain electrode 15b is formed a predetermined distance away from the source electrode 15a. The source 15a and the drain electrode 15b form electrical contacts with the corresponding ohmic contact layers.

A protection layer 26, made of an inorganic material such as $SiN_x$, is formed to cover the substrate including the source 15a and the drain electrode 15b. A pixel electrode 4 made of a transparent conductive material, such as indium tin oxide (ITO), is formed on the protection layer. The electrode 4 is electrically connected to the drain electrode 15b through a contact hole 31 formed in the protection layer 26.

Since the first substrate of the conventional AMLCD results in a TFT and bus lines with a stepped surface profile as shown in FIG. 4, the pixel electrode 4 needs to be formed a predetermined distance away from the gate bus line 17, data bus line 17, and the TFT. This stepped profile appears because an inorganic material, such as $SiN_x$ or $SiO_2$, is used for the gate insulating layer 23 and the protection layer 26.

Moreover, these stepped TFT and bus lines cause problems in the manufacture of an AMLCD. In particular, when an alignment film is formed on the stepped surface, the initial orientation of the liquid crystal becomes inhomogeneous. This degrades the quality of the LCD because of rubbing defects at the stepped portion of the alignment film.

In order to overcome such problems, an organic material with high planarization property is used for the gate insulating layer 23 or the protection layer 26. Then, the rubbing defects are eliminated, and the reduction in the performance of the LCD can be prevented. Moreover, an improvement in the aperture ratio can be achieved, since the pixel electrode 4 can be formed to overlap the bus lines.

However, the introduction of the organic material in a TFT structure causes new problems. The ON-characteristic of the TFT becomes unstable. For example, the ON-characteristics curve shifts toward the negative gate voltage as shown in FIG. 5. This is due to charge traps at the surface of the semiconductor layer 22 contacting the organic layer. Accordingly, better solutions are needed to obtain good planarization while preventing ON-characteristic instability.

SUMMARY OF THE INVENTION

Accordingly, the present invention is directed to a method of manufacturing an active matrix liquid crystal display and a liquid crystal display that substantially obviate the problems due to limitations and disadvantages of the related art.

An object of the present invention is to provide an AMLCD with an organic insulating layer with stable TFT characteristics.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a method for manufacture the first substrate of an AMLCD, including plasma treatment step of the semiconductor layer using $N_2$, $O_2$ or a gas containing N or F prior to coating the organic protection layer having the dielectric constant less than 3.0.

In another aspect, the present provides a method for manufacturing the first substrate of an AMLCD including a plasma treatment step on the organic gate insulating layer of BCB, in addition to the plasma treatment step of the semiconductor layer, using $N_2$, $O_2$ or a plasma gas containing N or F.

In another aspect, in a liquid crystal display having a thin film transistor including a gate electrode branching off from a gate line, a first insulation layer covering the gate electrode, a semiconductor layer, an ohmic contact layer, a source and a drain electrode branching off from a data bus line, and a second insulation layer covering the semiconductor layer, the present invention provides a method of manufacturing the liquid crystal display comprising the steps of performing a surface-treatment on a surface of the semiconductor layer; and forming the second insulation layer made of an organic material on the surface-treated surface of the semiconductor layer.

In another aspect, the present invention provides a liquid crystal display comprising a substrate; a thin film transistor over the substrate, the thin film transistor including: a gate electrode contacting a gate line; a semiconductor layer; and a first insulation layer between the semiconductor layer and the gate electrode; ohmic contact layers on the semiconductor layer; source and drain electrodes each contacting corresponding ohmic contact layers, at least one of the source and drain electrodes being in contact with a data bus line; a second insulation layer made of an organic material covering the semiconductor layer; and a first surface treatment layer at an interface of semiconductor layer and the second insulation layer.

In a further aspect, the present invention provides a method for manufacturing a liquid crystal display device on a substrate, comprising forming a thin film transistor over the substrate, the thin film transistor including a semiconductor layer; performing a plasma treatment to a surface of the semiconductor layer using at least one of $N_2$, $O_2$, N containing gas and F containing gas; and coating an organic material over the thin film transistor to form a protection layer.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 10 is a plan view showing the structure of an active matrix liquid crystal display according to the present invention;

DETAILED DESCRIPTION OF THE PREFERRED EMBODIMENT

Reference will now be made in detail to the preferred embodiment of the present invention, examples of which are illustrated in the accompanying drawings.

An organic material for the protection layer and/or the gate insulation layer of a thin film transistor for an AMLCD may be selected from benzocyclobutene (BCB) and perfluorocyclobutane (PFCB)in the present invention. The present invention will be explained using BCB which has a dielectric constant less than 3.0 and an Si—O bond structure.

The importance of treating the semiconductor layer with plasma prior to coating an organic layer according to the present invention is described by reviewing the formation process of the semiconductor layer.

Figure 6:
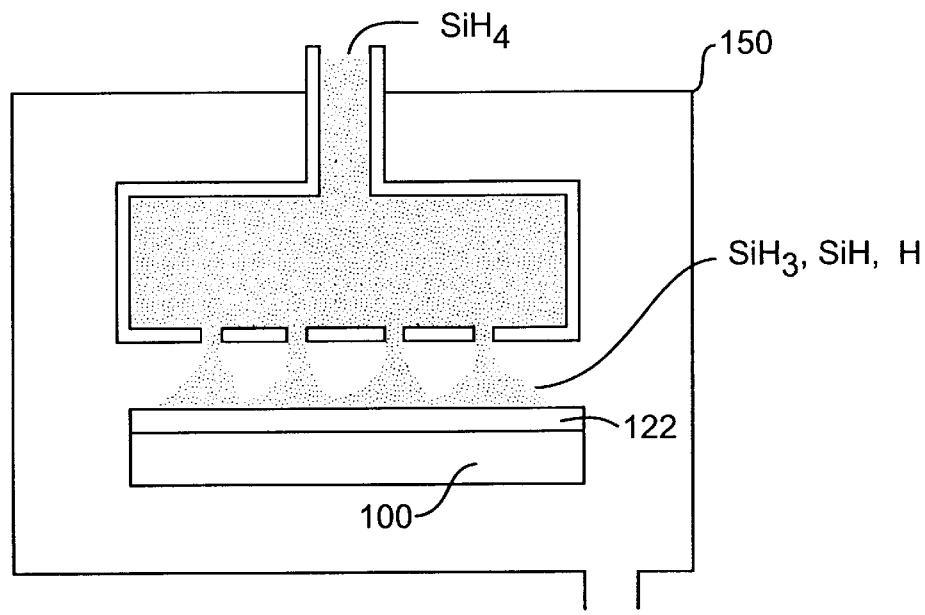
FIG. 6 is a cross-sectional view of a plasma treatment apparatus in accordance with the present invention.
Figure 7:
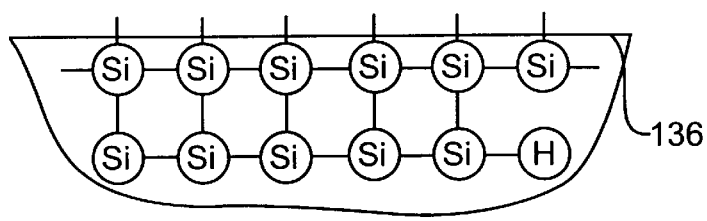
FIG. 7 is a diagram showing the chemical structure of a semiconductor layer having dangling bonds at the surface prior to plasma treatment.

As shown in FIG. 6, when a silane gas $SiH_4$ is introduced and discharged in a plasma apparatus 150, a plasma is formed including $SiH_3^+$, $SiH_2^{2+}$ and $H^+$ radicals. The reaction of the plasma gas results in a deposition of an amorphous silicon 122 (a—Si:H) on a substrate 100. The chemical structure of the semiconductor layer made of a—Si:H includes bonding defects such as dangling bonds at the surface, as shown in FIG. 7.

Figure 1:
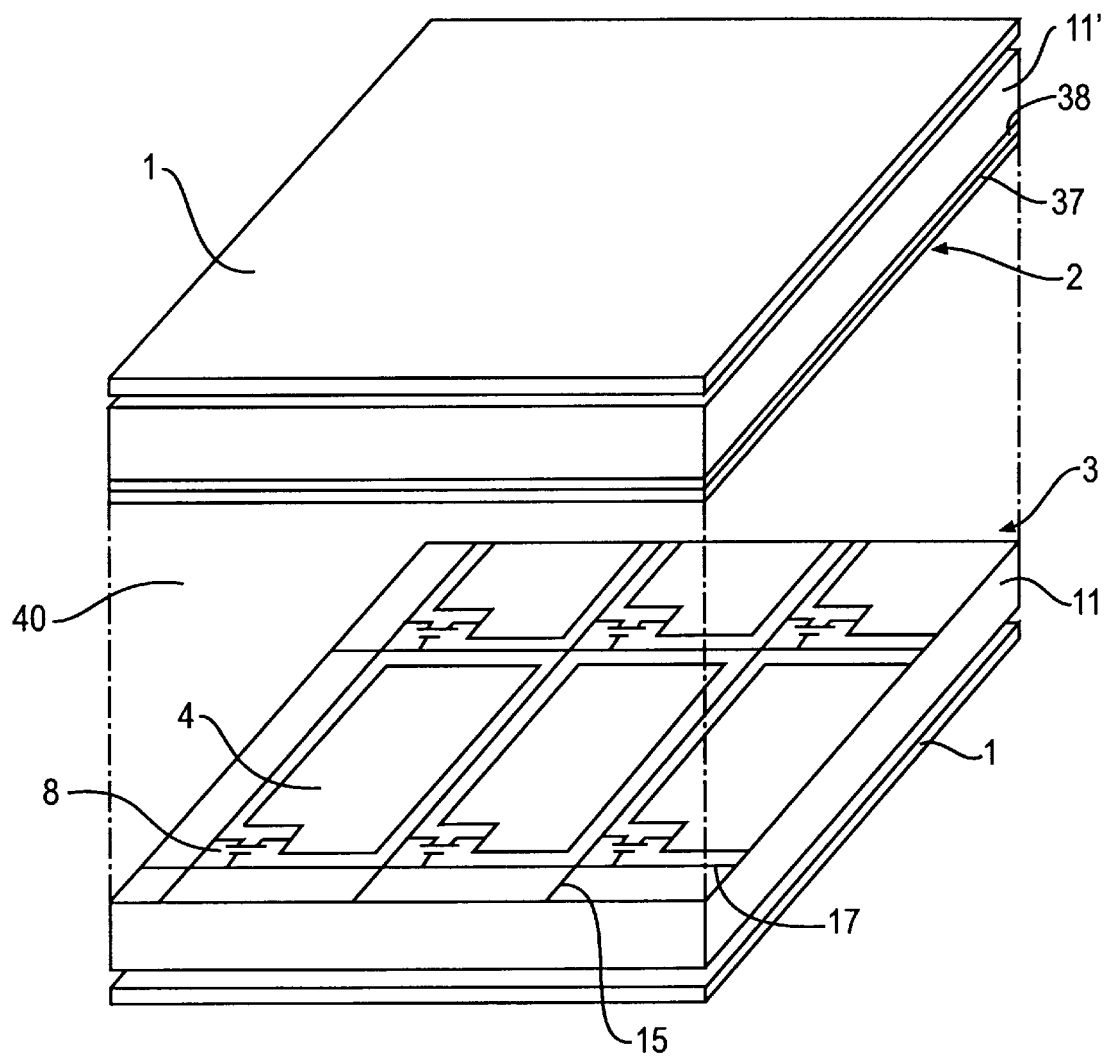
FIG. 1 is a perspective view showing the structure of a conventional active matrix liquid crystal display.
Figure 2:
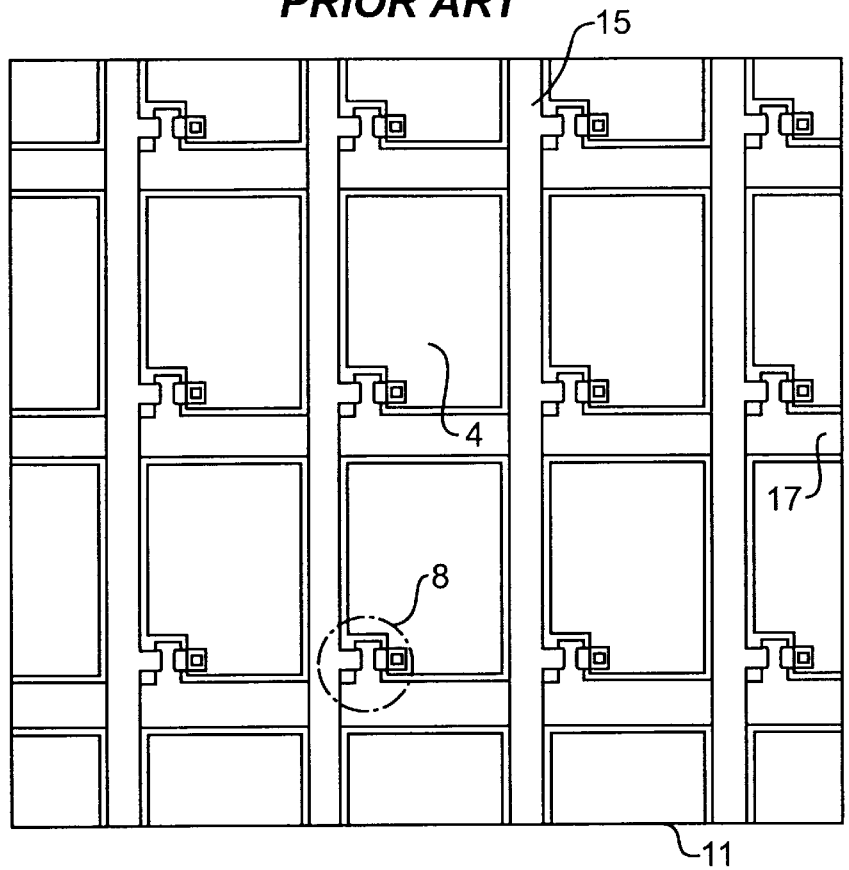
FIG. 2 is a plan view showing the structure of the conventional active matrix liquid crystal display.
Figure 2A:
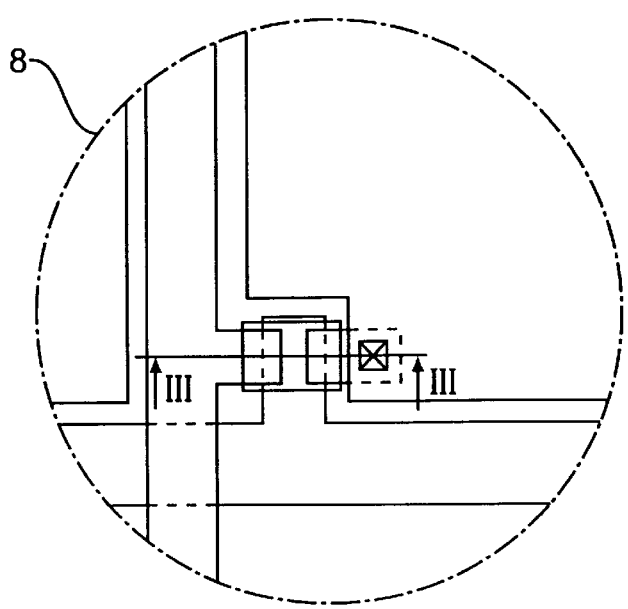
Figure 3:
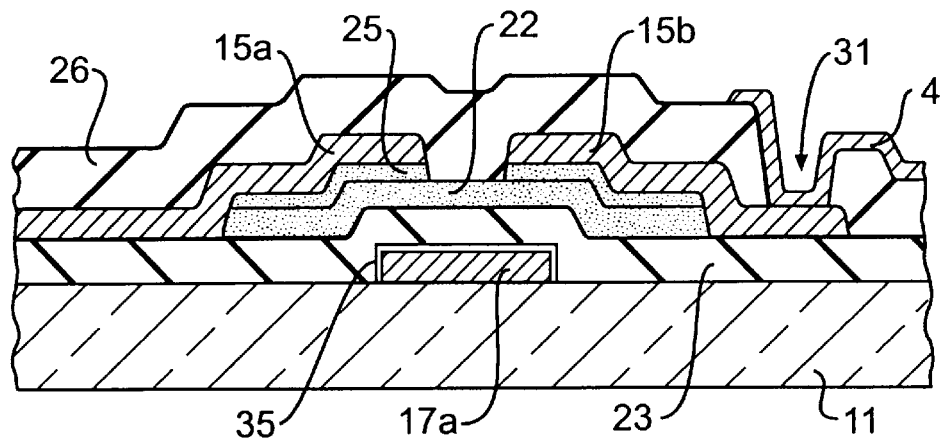
FIG. 3 is a cross-sectional view showing the structure of the conventional active matrix liquid crystal display, taken along the line III—III in FIG. 2.
Figure 4:
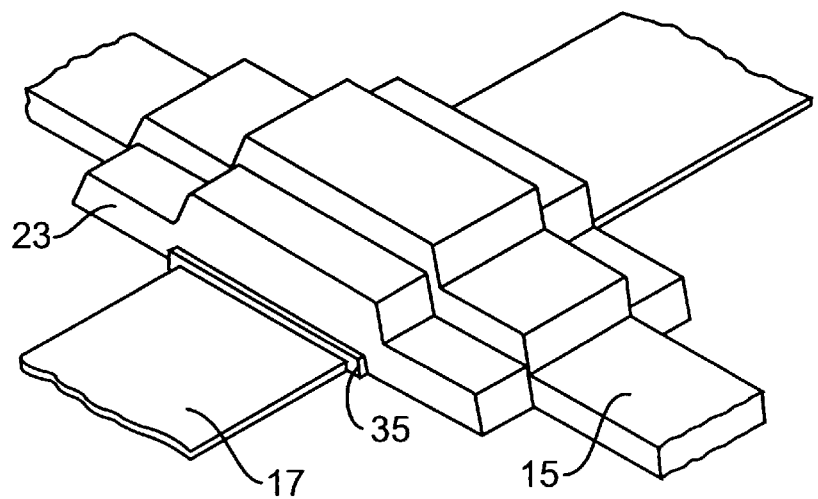
FIG. 4 is a perspective view showing a stepped surface at the cross-section between a gate bus line and a data bus line.
Figure 5:
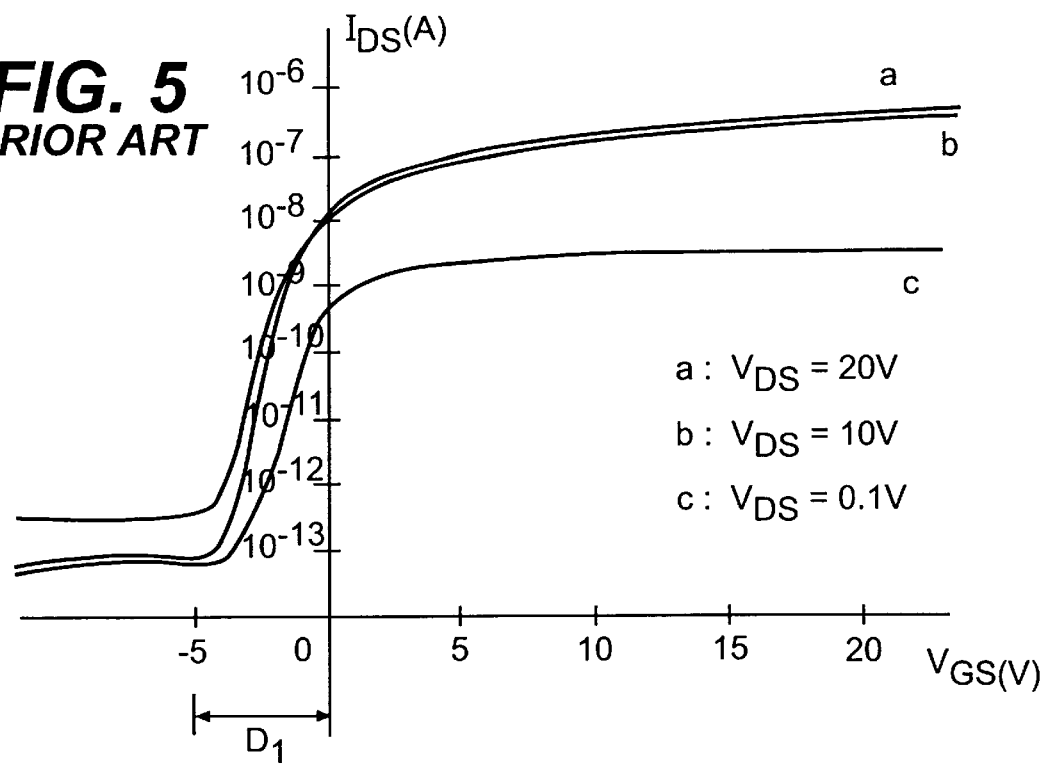
FIG. 5 shows the ON-characteristics curve of a conventional TFT using an organic protection layer.

When the semiconductor layer 122 including such bonding defects is coated with an organic protection layer by spin-coating, unstable surface characteristic of the semiconductor layer results due to poor bonding with the organic layer and detachment of the organic layer. Moreover, the dangling bonds at the surface of the semiconductor layer become charge traps for electrons, shifting the TFT ON-characteristic curves towards the negative voltage direction (FIG. 5). This results in an unstable TFT characteristic and a circuit needs to be undesirably driven at a voltage lower than the TFT ON voltage.

Figure 8:
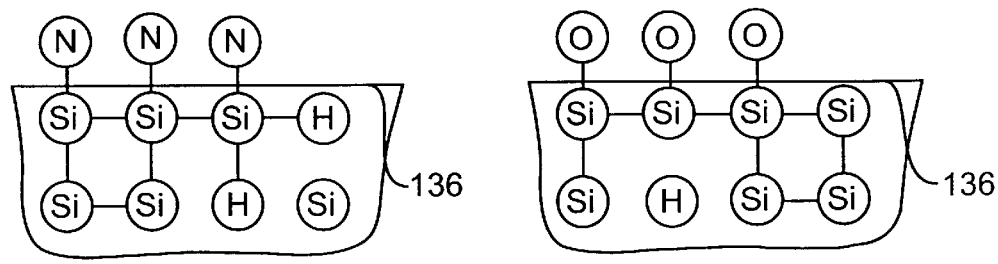
FIG. 8 is a diagram showing the chemical structure of a semiconductor layer after performing a plasma treatment on the surface using an $N_2$ or $O_2$ gas in accordance with the present invention.

Thus, in the present invention, the surface 136 of the semiconductor layer is plasma-treated by $N_2$, $O_2$ or a gas containing N or F to prevent bonding defects and detachment of organic layer from the semiconductor layer. Such surface treatment of the semiconductor layer by $N_2$, $O_2$ or a gas containing N or F produces a stable bond structure, such as Si—N or Si—O, as shown in FIG. 8. Therefore, by coating an organic layer on the surface 136 of the semiconductor layer 122 having Si—O or Si—N bonds, a stable bonding is established between the semiconductor layer and the organic layer, eliminating the possibility of detachment at the interface and providing a stable TFT ON-characteristic.

Figure 9:
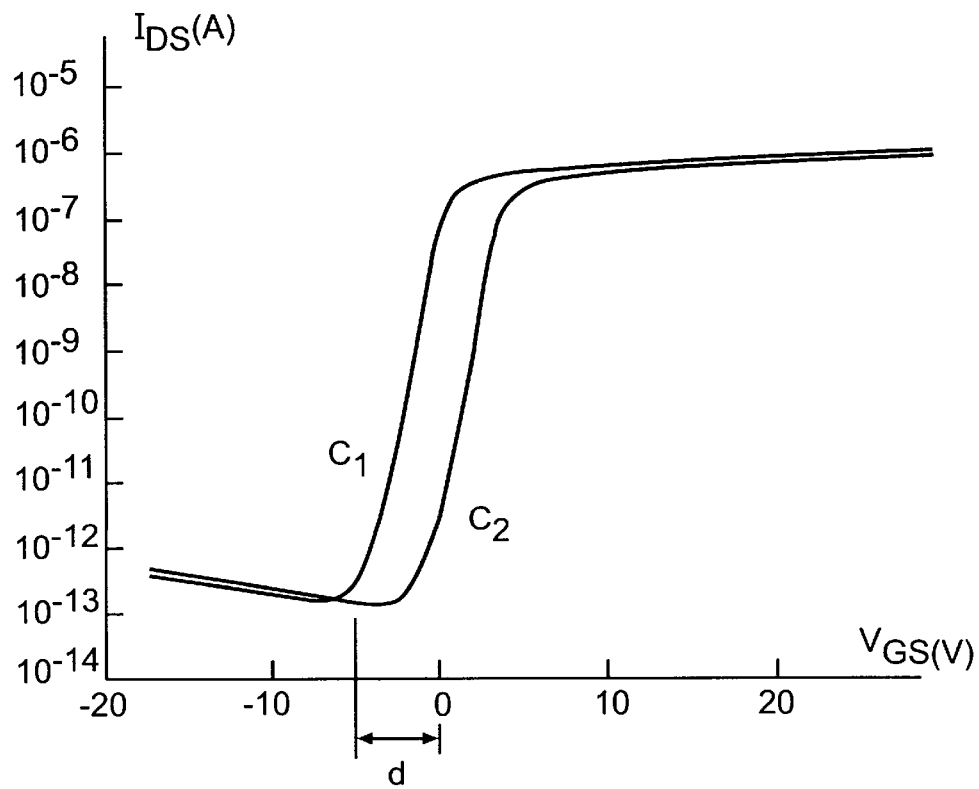
FIG. 9 shows the characteristics curves of a TFT using an organic protection layer after plasma treatment according to the present invention.

Referring to FIG. 9, the experimental result of the TFT ON-characteristic after coating an organic protection layer such as BCB on the semiconductor layer shows that the characteristic curve C2 (after plasma treatment with $N_2$, $O_2$ or a gas containing N or F) has an improved TFT ON-characteristic without a shift (d), as compared with the characteristic curve Cl without the plasma treatment.

First Preferred Embodiment

The method of manufacturing the first substrate of an AMLCD is explained with reference to FIG. 10. FIG. 10 shows a plan view of the first substrate of an AMLCD according to the present invention. FIGS. 11A to 11H show cross-sectional views taken along the line V—V in FIG. 10.

Figure 11A:
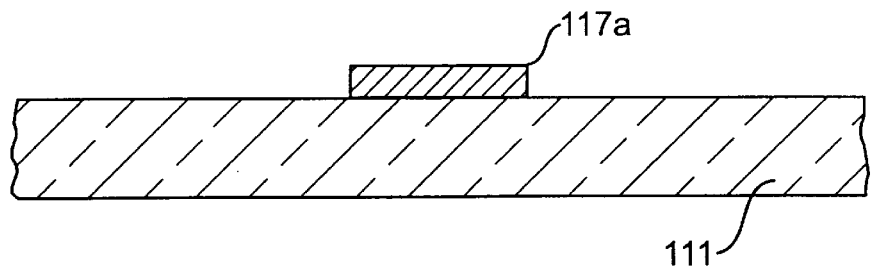
FIGS. 11A to 11H, 12A, and 12B are cross-sectional views showing the manufacturing steps of a first substrate of an active matrix liquid crystal display according to a first embodiment of the present invention, taken along the line V—V in FIG. 10.
Figure 11B:
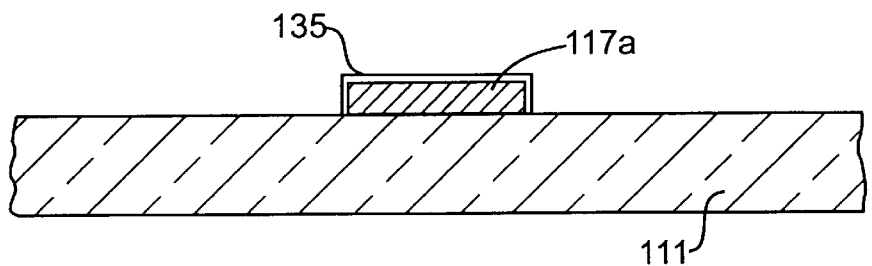

A metal layer, such as Al, Al—Ta, Al—Mo, Ta or Ti (which can be anode-oxidized) or Cr, is deposited on a transparent glass substrate 111 and patterned to form a gate bus line 117 and gate electrode 117a branching off therefrom (FIG. 11A). When a metal that can be anode-oxidized is used, an anodic oxide layer 135 is formed on the gate bus line and the gate electrode 117a to improve insulating property and prevent hill-locks (FIG. 11B).

Figure 11C:
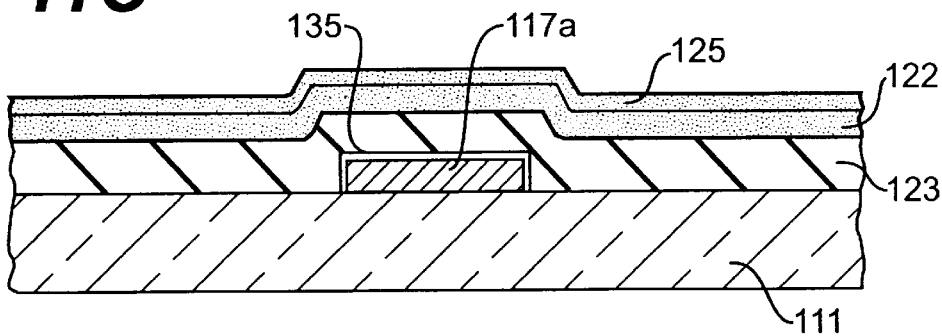
Figure 11D:
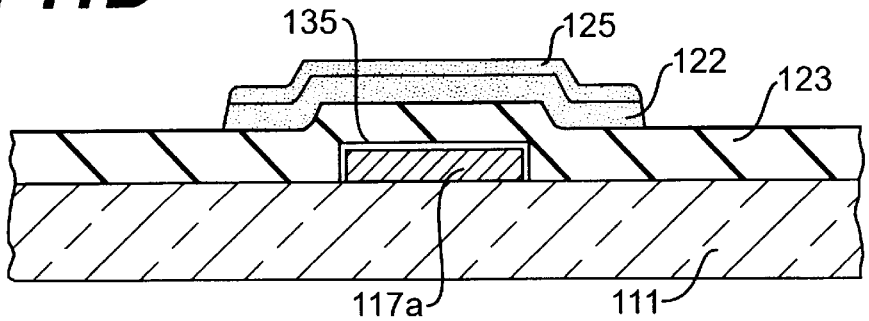
Figure 11E:
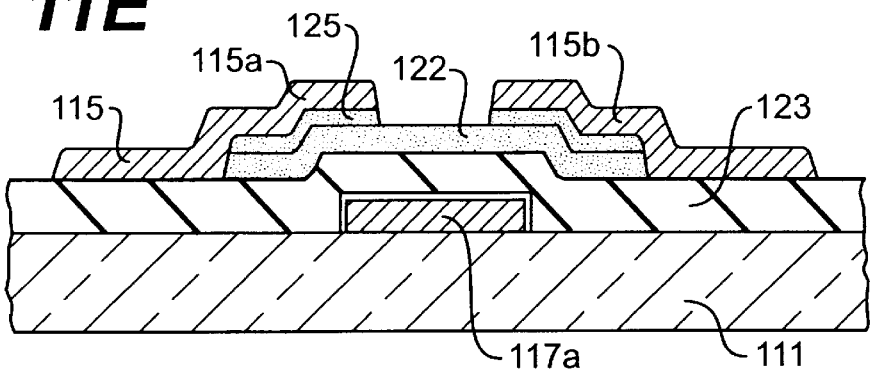

Then, the overall surface is deposited with an inorganic material such as $SiN_x$ or $SiO_2$, to form a gate insulation film 123. An a—Si and an $n^+$ a—Si are then sequentially deposited on the insulation film layer 123 (FIG. 11C). The a—Si and $n^+$ a—Si are patterned together to form a semiconductor layer 122 and an ohmic contact layer 125 (FIG. 11D). Then, a metal such Al alloy is deposited on the ohmic contact layer and is patterned to form a data bus line 115, a source electrode 115a branching off from the data line, and a drain electrode 115b as an output terminal. The exposed portion of the ohmic contact layer is removed using the source 115a and drain electrode 115b as a mask (FIG. 11E).

Figure 11F:
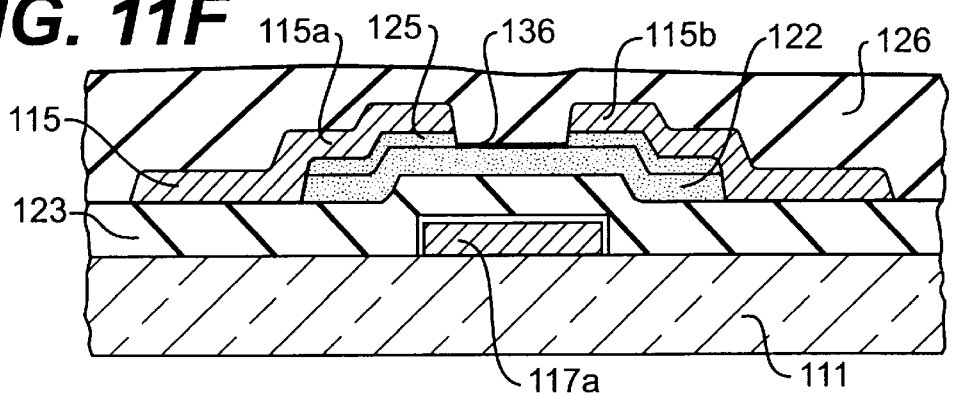
Figure 11G:
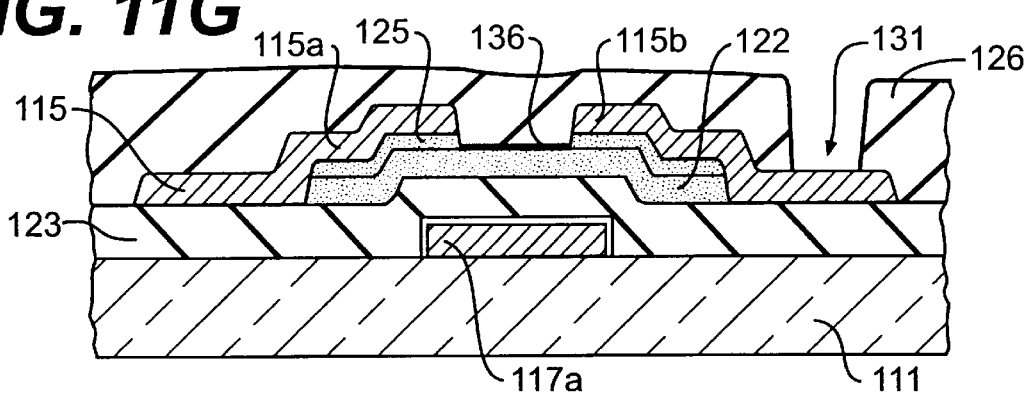

Subsequently, the exposed portion of the semiconductor layer is plasma-treated using $N_2$, $O_2$ or a gas containing N or F to form a surface treated layer 136. Then, a protection layer made of an organic material, such as BCB or PFCB, is formed on the overall substrate 111 (FIG. 11F). A contact hole 131 is formed to expose the drain electrode 115b through the protection layer 126 over the drain electrode 115b. Then, a transparent conductive material such as indium tin oxide (ITO) is deposited on the substrate including the protection layer 126 and patterned to form a pixel electrode 104, which makes an electrical contact with the drain electrode 115b and overlaps the data bus line 115 (FIG. 11H).

Figure 12A:
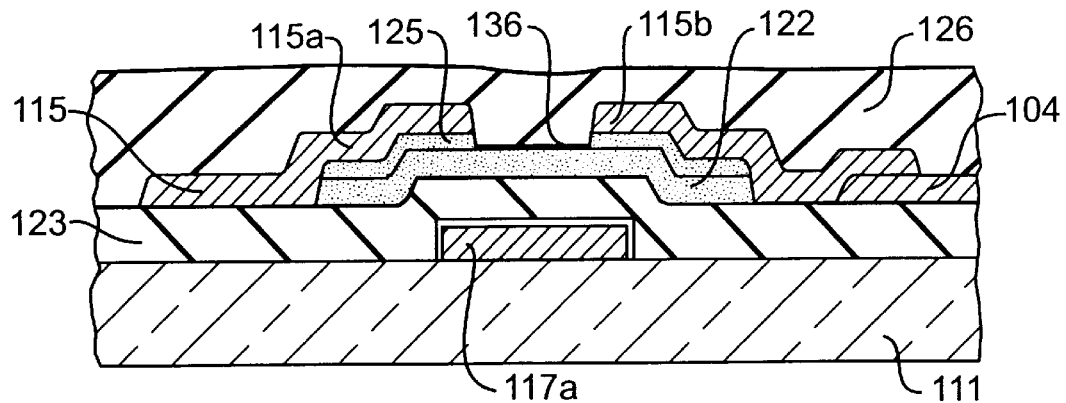
Figure 12B:
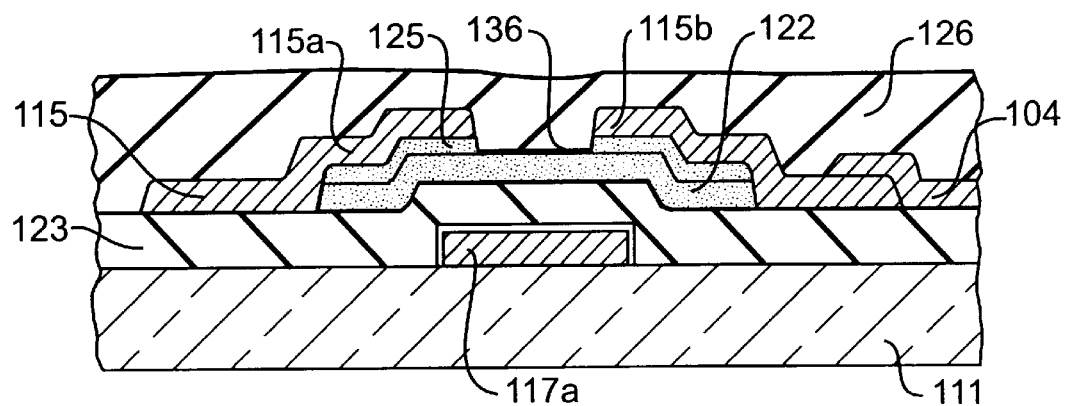

Although the first embodiment of the present invention has been explained using an IOP (ITO on passivation) structure forming the pixel electrode on the protection layer, the present invention can be applied to other TFT structures, irrespective of the sequence of the pixel forming step. For example, the pixel electrode may be formed before or after forming the source and drain electrodes (FIGS. 12A and 12B).

Figure 11H:
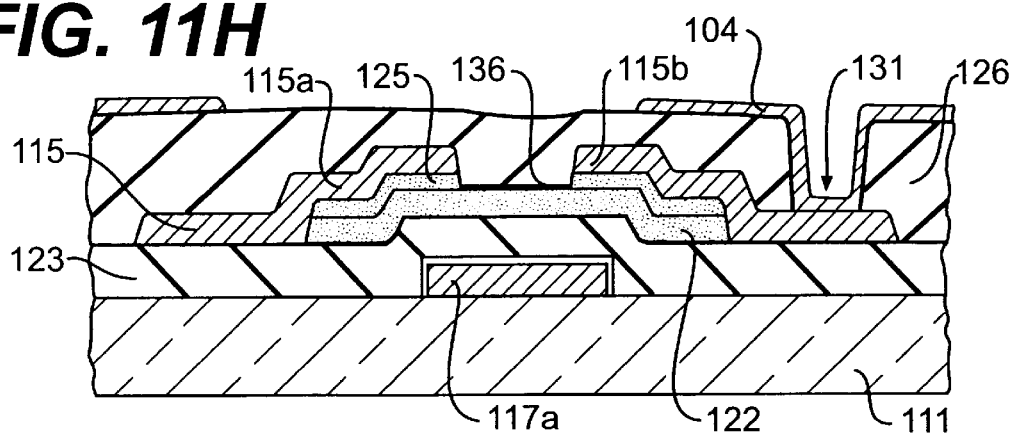
Figure 13:
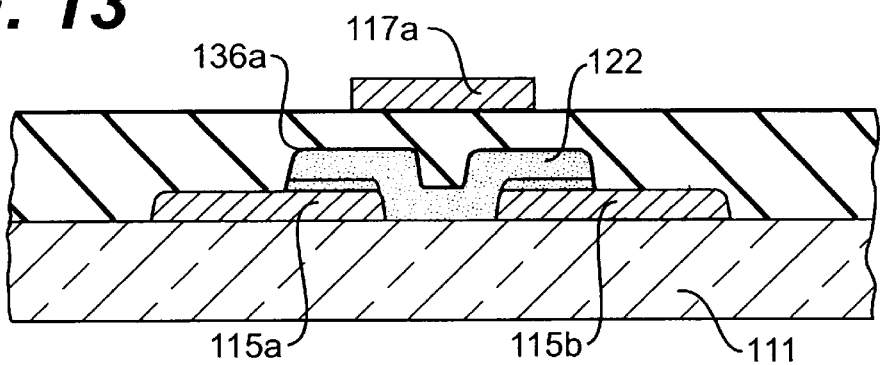
FIGS. 13, 14, and 15 are cross-sectional views showing a first substrate of an active matrix liquid crystal display with various TFT structures applicable for the present invention, taken along the line V—V in FIG. 10.
Figure 14:
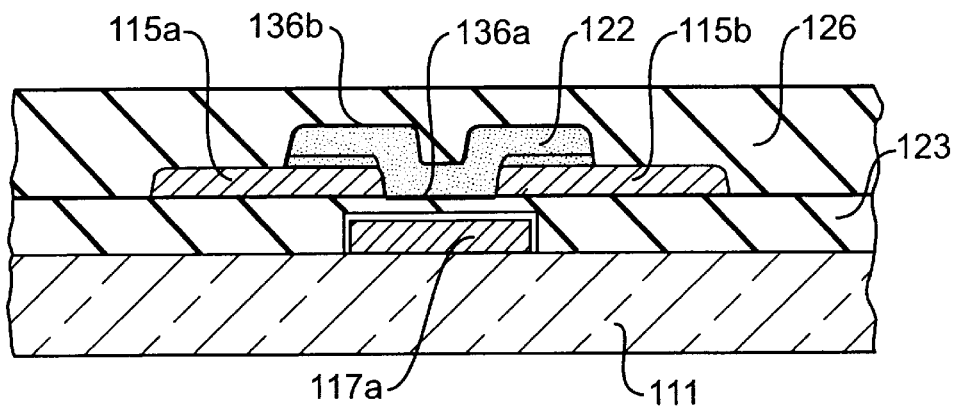
Figure 15:
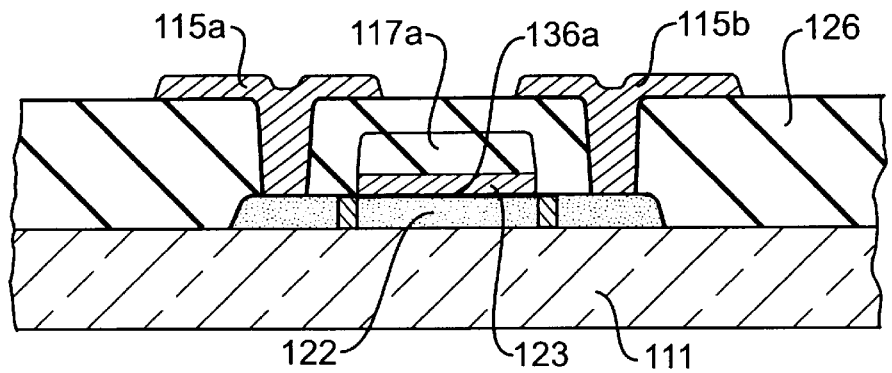

Further, as shown in FIGS. 13, 14, and 15, the present invention can be applied to staggered TFT, coplanar TFT, and self-aligned TFT, respectively, as well as the inverse staggered TFT of FIG. 11H.

Thus, according to the present invention, the pixel electrode 104 can be formed to overlap a portion of the TFT as well as the gate 117 and data bus line 115, as shown in FIG. 10, thereby improving the aperture ratio.

Additionally, the pixel electrode 104 overlapping the gate bus line 117 can act as a storage capacitance electrode.

Second Preferred Embodiment

Another embodiment of the method for manufacturing the first substrate of an AMLCD of the present invention is explained with reference to FIGS. 16A to 16H. FIGS. 16A to 16H show cross-sectional views taken along the line V—V in FIG. 10.

Figure 16A:
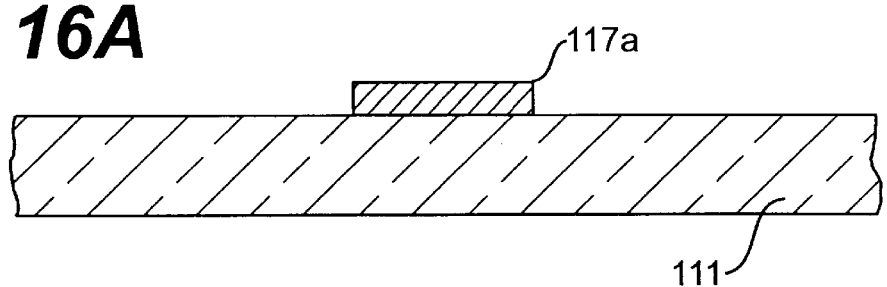
FIGS. 16A to 16H, 17A, and 17B are cross-sectional views showing a first substrate of an active matrix liquid crystal display according to a second embodiment of the present invention, taken along the line V—V in FIG. 10.
Figure 16B:
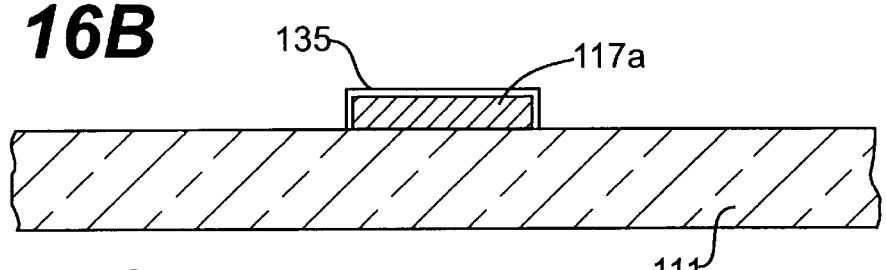

A metal layer, such as Al, Al—Ta, Al—Mo, Ta or Ti (which can be anode-oxidized) or Cr, is deposited on a transparent glass substrate 111 and patterned to form a gate bus line 117 and gate electrode 117a branching off therefrom (FIG. 16A). When a metal that can be anode-oxidized is used, an anodic oxide layer 135 is formed on the gate bus line 117 and the gate electrode 117a to improve insulating property and prevent hill-locks (FIG. 16B).

Figure 16C:
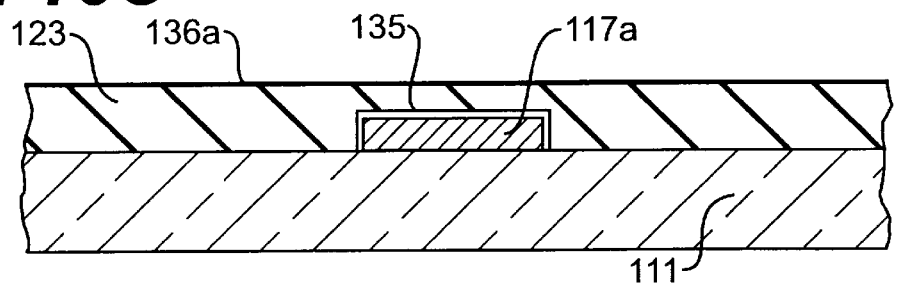

Then, the overall surface is deposited with an organic material such as BCB or PFCB to form a gate insulation layer. The organic material is then plasma-treated using $N_2$, $O_2$, or a gas containing N or F to form a surface treated layer 136a (FIG. 16C).

Figure 16D:
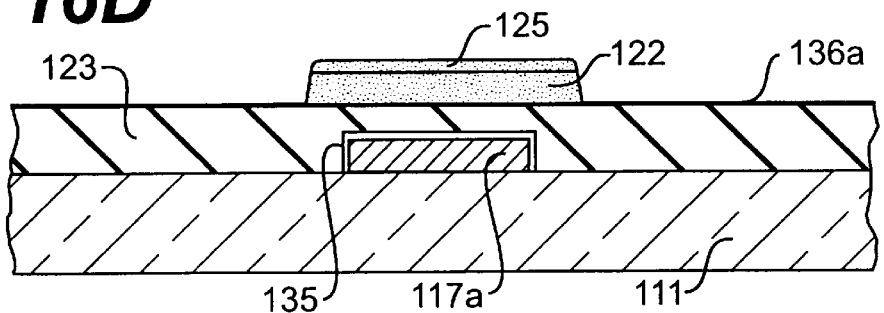
Figure 16E:
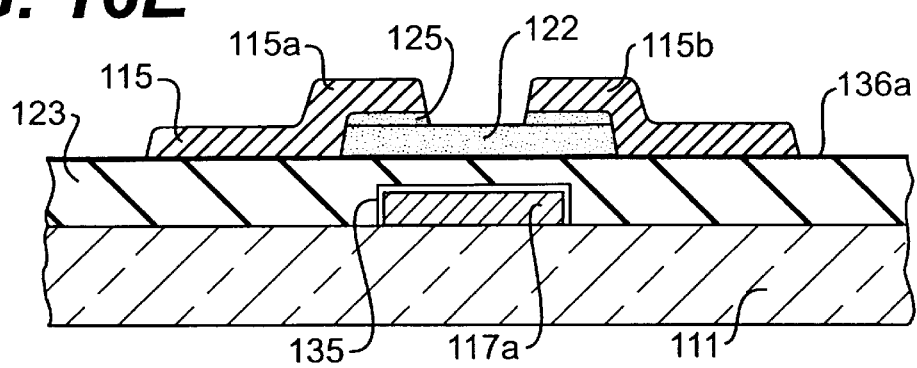

Then, an a—Si and an $n^+$ a—Si are sequentially deposited on the surface treated layer 136a and patterned together to form a semiconductor layer 122 and ohmic contact layer 125 (FIG. 16D). Next, a metal such as Al alloy is deposited on the ohmic contact layer 125 and patterned to form a data bus line 115, a source electrode 115a branching off from the data line, and a drain electrode 115b as an output terminal. The exposed portion of the ohmic contact layer is removed by using the source electrode 115a and drain electrode 115b as a mask (FIG. 16E).

Figure 16F:
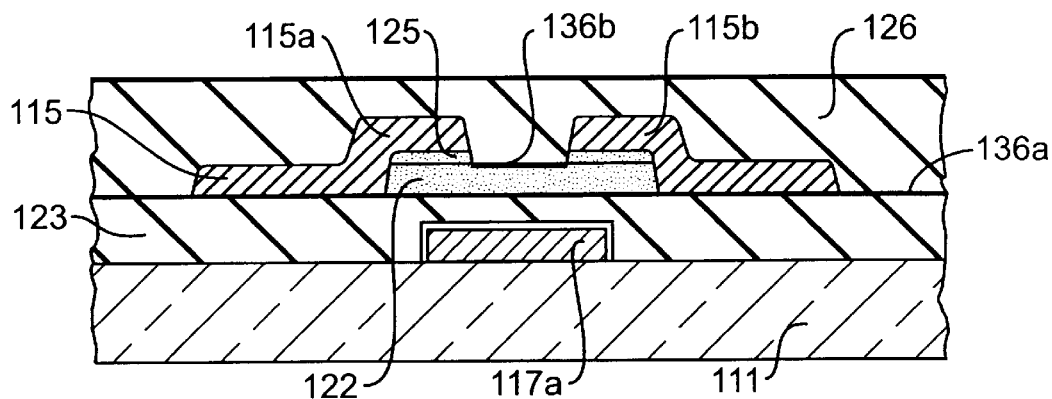

Subsequently, the exposed portion of the semiconductor layer is plasma-treated using $N_2$, $O_2$ or a gas containing N or F to form a surface treated layer 136b. Then, a protection layer made of an organic material, such as BCB or PFCB, is formed on the overall surface of the substrate 111 (FIG. 16F).

Figure 16G:
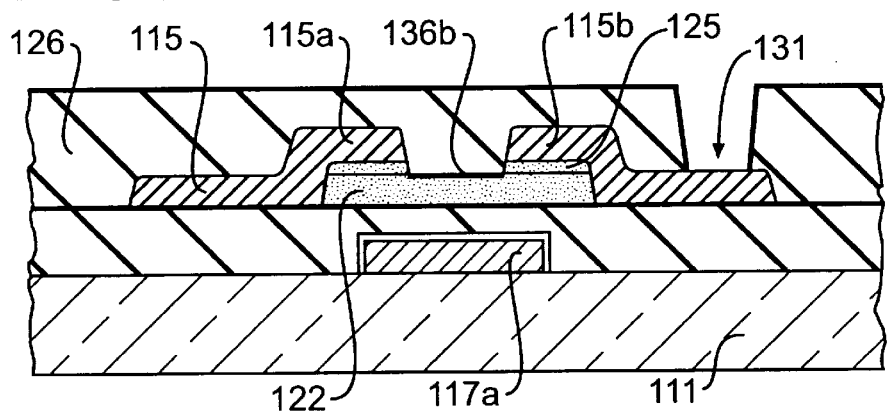
Figure 16H:
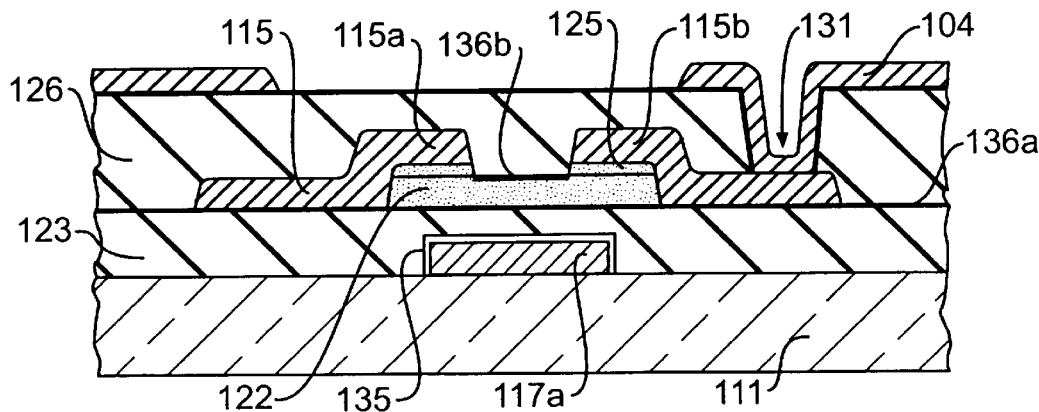

A contact hole 131 is formed to expose a portion of the drain electrode 115b through the protection layer 126 over the drain electrode 115b (FIG. 16G). An ITO layer is deposited over the substrate including the protection layer 126 and patterned to form a pixel electrode 104, which makes an electrical contact with the drain electrode 115b and partially overlaps the data bus line 115 (FIG. 16H).

The plasma treatment on the organic gate insulating layer 123 and the semiconductor layer 122 using $N_2$, $O_2$ or a gas containing N or F modifies the surface bond structure of the organic layers so as to stabilize the TFT ON-characteristic. This treatment eliminates charge traps at the interface between the semiconductor layer 122 and the organic layer to prevent detachment and patterning defects of inorganic layers, such as metal, ITO, and a—Si layers, on the organic layer.

Figure 17A:
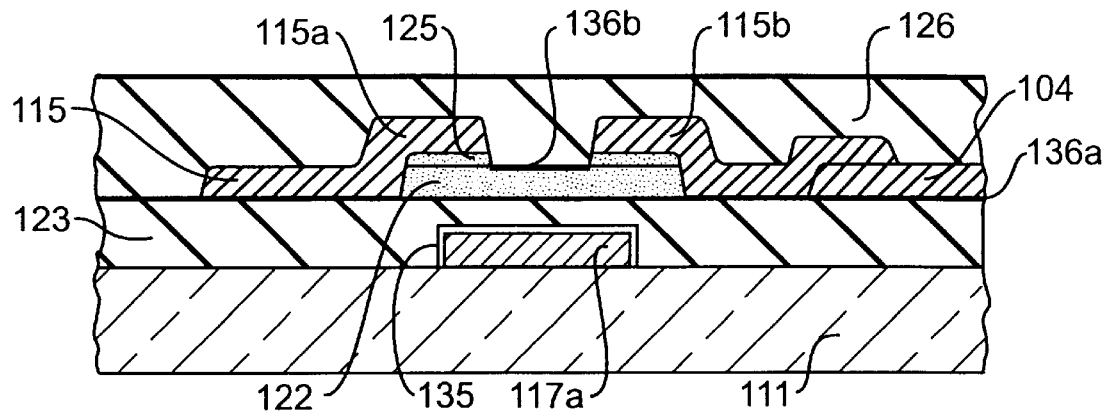
Figure 17B:
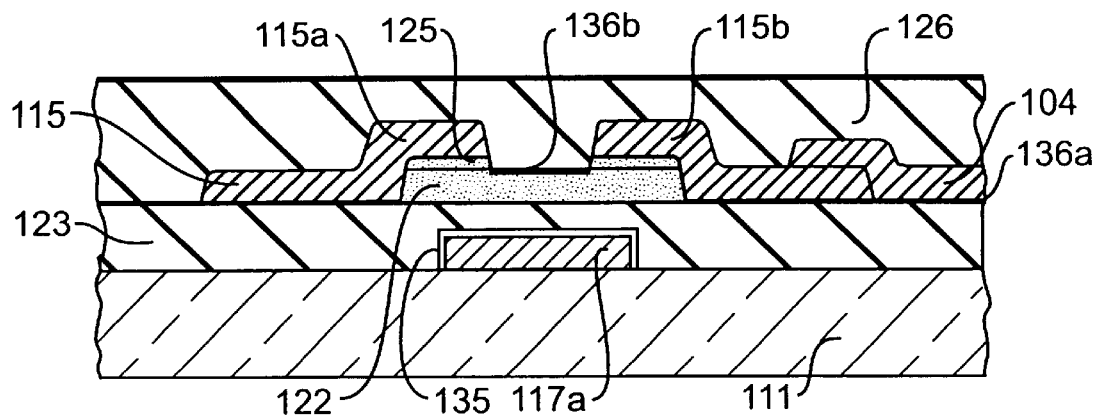

The second embodiment has been explained above using an IOP (ITO on passivation) structure which forms the pixel electrode on the protection layer, as in the first embodiment. However, the second embodiment of the present invention can also be applied to other TFT structures, irrespective of the sequence of the pixel forming step. For example, the pixel electrode may be formed before or after forming the source and drain electrodes (FIGS. 17A and 17B).

In the embodiments described above, a—Si layers are used as semiconductor layers. Alternatively, other semiconductors such as polycrystalline silicon may be used as the semiconductor layer.

Using an organic material, such as BCB or PFCB, for forming the gate insulating layer 123 and/or the protection layer 126 and by performing a plasma treatment on the organic insulating layer 123, the AMLCD thus manufactured in accordance with the present invention has an improved aperture ratio with stable TFT characteristic.

In addition to BCB and BFCD, fluorinated polyimide, teflon, cytop, fluoropolyarylether and fluorinated para-xylene each having a dielectric constant of less than 3.0 may be used as the gate insulating layer and/or the passivation layer. These materials are listed in Table 1 below.

TABLE 1

Dielectric Constant of organic materials

| Organic material | Dielectric constant | Structure |
|---|---|---|
| Fluorinated polyimide | 2.7 | 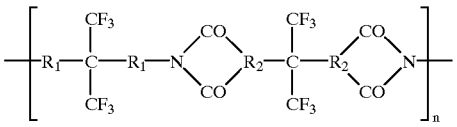 |
| Teflon | 2.1–1.9 | 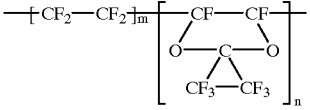 |
| Cytop | 2.1 | 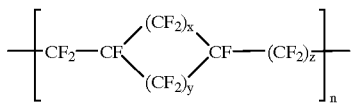 |
| BCB | 2.7 | 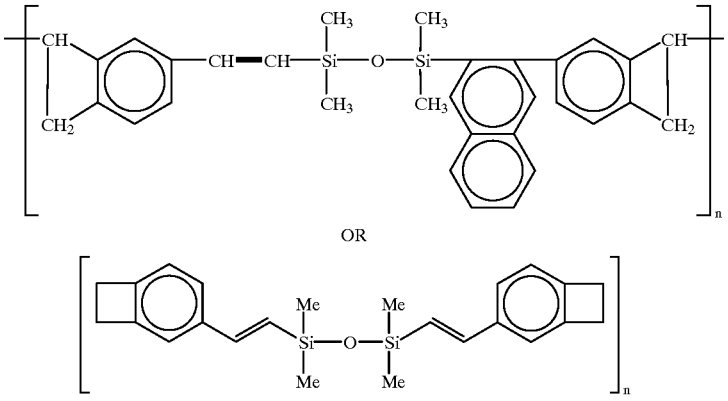 |
| Fluoro-polyarylether | 2.6 | 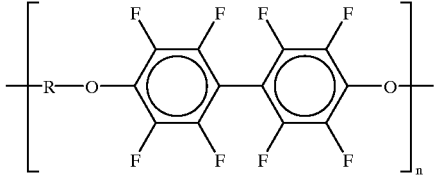 |
| Fluorinated para-xylene | 2.4 | 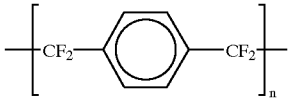 |

In the present invention, the surface of the semiconductor layer is plasma-treated using $N_2$, $O_2$ or a gas containing N or F, forming a stable bond structure of Si—O or Si—N on the surface. Accordingly, the interfacial problems between the semiconductor layer and the organic protection layer, such as charge traps and detachment, can be eliminated. Similarly, the surface of a gate insulating layer, which is in contact with the semiconductor layer and made of organic material, can also be plasma-treated to prevent the interfacial problems.

It will be apparent to those skilled in the art that various modifications and variations can be made in the method for manufacturing a liquid crystal display device and the liquid crystal display device of the present invention without departing from the spirit or scope of the invention. Thus, it is intended that the present invention cover the modifications and variations of this invention provided they come within the scope of the appended claims and their equivalents.

What is claimed is:

1. A method of manufacturing a liquid crystal display having a thin film transistor including a gate electrode extending from a gate line, a first insulation layer covering the gate electrode, a semiconductor layer over the first insulating layer, a source electrode extending from a data bus line and connected to a portion of the semiconductor layer through an ohmic contact layer, a drain electrode connected to another portion of the semiconductor layer through an ohmic contact layer, and a second insulation layer covering the semiconductor layer, the method comprising the steps of:

performing a surface-treatment on a surface of the semiconductor layer; and forming the second insulation layer made of an organic material on the treated surface of the semiconductor layer, wherein the step of performing a surface-treatment and the step of forming the second insulating layer are performed in such a way as to provide a stable bond structure substantially free from bonding defects at an interface between the semiconductor layer and the second insulation layer so that detachment of the second insulation layer from the semiconductor layer is prevented and a stable ON-characteristic of the thin film transistor is obtained.

2. The method according to claim 1, wherein the surface treatment performing step includes the step of performing a plasma treatment.

3. The method according to claim 2, wherein the plasma treatment performing step includes the step of performing the plasma treatment using a gas including at least one of $N_2$, $O_2$, N containing gas and F containing gas.

4. The method according to claim 1, further comprising the steps of forming the first insulation layer made of an organic material and forming the semiconductor layer over the first insulation layer before the surface-treatment performing step.

5. The method according to claim 4, further comprising the step of performing a surface-treatment on a surface of the first insulation layer before the step of forming the semiconductor layer.

6. The method according to claim 5, wherein the surface treatment performing step includes the step of performing a plasma treatment.

7. The method according to claim 6, wherein the plasma treatment step includes the step of performing the plasma treatment using a gas including at least one of $N_2$, $O_2$, N containing gas and F containing gas.

8. The method according to claim 1, further comprising the step of forming a pixel electrode on at least one of the first and the second insulation layers.

9. The method according to claim 8, wherein the step of forming the pixel electrode includes the step of forming the pixel electrode to at least partially overlap the data bus line.

10. The method according to claim 8, wherein the step of forming the pixel electrode includes the step of forming the pixel electrode to at least partially overlap the data bus line and the gate bus line.

11. The method according to claim 8, wherein in the step of forming the pixel electrode, the pixel electrode is formed on one of the source electrode and the drain electrode.

12. The method according to claim 8, further comprising the step of forming the pixel electrode before the step of forming the source and drain electrodes.

13. The method according to claim 1, wherein the step of forming the second insulating layer made of the organic material includes forming the organic material having a dielectric constant of less than 3.0.

14. The method according to claim 13, wherein the step of forming the second insulating layer made of the organic material includes forming the organic material having an Si—O bond structure.

15. The method according to claim 14, wherein the step of forming the second insulating layer made of the organic material includes forming the organic material having at least one of BCB and PFCB.

16. A method of manufacturing a liquid crystal display device on a substrate, the method comprising the steps of:

forming a thin film transistor over the substrate, the thin film transistor including a semiconductor layer having an exposed surface;

performing a plasma treatment on the exposed surface of the semiconductor layer using at least one of $N_2$, $O_2$, N containing gas and F containing gas; and depositing an organic material on the exposed surface of the thin film transistor to form a protection layer, wherein the step of performing a plasma treatment and the step of depositing an organic material are performed in such a way as to provide a stable bond structure substantially free from bonding defects at an interface between the semiconductor layer and the protection layer so that detachment of the protection layer from the semiconductor layer is prevented and a stable ON-characteristic of the thin film transistor is obtained.

17. The method according to claim 16, wherein the step of forming the thin film transistor includes the steps of:

coating an organic material to form a gate insulation layer;

performing a plasma treatment on the gate insulation layer using at least one of $N_2$, $O_2$, N containing gas and F containing gas; and forming the semiconductor layer over the plasma-treated gate insulation layer.

18. A method of manufacturing a liquid crystal display device on a substrate, the method comprising the steps of:

forming a thin film transistor over the substrate, the thin film transistor including a semiconductor layer having an exposed surface;

performing a plasma treatment on the exposed surface of the semiconductor layer using at least one of $N_2$, $O_2$, N containing gas and F containing gas to form a stable bond structure substantially free from bonding defects at the exposed surface; and depositing an organic material on the plasma-treated exposed surface of the semiconductor layer to form a protection layer before performing any intervening step that degrades the plasma-treated exposed surface of the semiconductor layer so that the plasma-treated exposed surface remains substantially intact when the protection layer is formed thereon.

19. The method according to claim 18, wherein the step of forming a thin film transistor includes the steps of:

coating an organic material over the substrate to form a gate insulation layer;

performing a plasma treatment on the gate insulation layer using at least one of $N_2$, $O_2$, N containing gas and F containing gas; and forming the semiconductor layer over the plasma-treated gate insulation layer.

* * * * *